United States Patent [19]
Henderson et al.

[11] Patent Number: 5,594,339
[45] Date of Patent: Jan. 14, 1997

[54] FLEXIBLE NUCLEAR MAGNETIC RESONANCE RECEIVER COILS AND SYSTEMS

[75] Inventors: Robert G. Henderson, Wickliffe; James W. Kristoff, Lyndhurst; David A. Molyneaux, Mentor, all of Ohio

[73] Assignee: Picker International, Inc., Highland Heights, Ohio

[21] Appl. No.: 500,821

[22] Filed: Jul. 11, 1995

[51] Int. Cl.⁶ .................................................. G01V 3/00
[52] U.S. Cl. ....................................... 324/318; 128/653.5
[58] Field of Search ................................ 324/318, 322, 324/314, 307, 309; 128/653.5

[56] References Cited

U.S. PATENT DOCUMENTS

| | | | |
|---|---|---|---|
| 4,825,162 | 4/1989 | Roemer et al. | 324/318 |
| 4,918,388 | 4/1990 | Mehdizadeh et al. | 324/322 |
| 4,920,315 | 4/1990 | Hokbrook et al. | 324/322 |
| 4,920,318 | 4/1990 | Misic et al. | 324/318 |
| 5,196,796 | 3/1993 | Misic et al. | 324/322 |
| 5,296,813 | 3/1994 | Holmes et al. | 324/322 |
| 5,394,087 | 2/1995 | Molyneaux | 324/318 |

Primary Examiner—Louis M. Arana
Attorney, Agent, or Firm—Fay, Sharpe, Beall, Fagan, Minnich & McKee

[57] ABSTRACT

A resonance exciting coil (C) disposed in an image region in which a main magnetic field and transverse gradients have been produced. A flexible receiving coil (D) includes a flexible plastic sheet (40) on which an electrically continuous flexible foil strip (36) is adhered to receive signals from the resonating nuclei. The coil also includes components (24), mounted on the flexible plastic sheet (40), which may amplify the received signals before they are transmitted along a cable (22). A first soft material layer (44) is mounted on the flexible plastic sheet (40) for providing comfort to the patient. A flexible mechanical structure (50) on which two flexible receiving coils (F, G) adjusts an overlap between the coils (F, G) as the coils are flexed to adjust interaction properties of the coils (FIGS. 4 A, 4B). Pivotal rods (56) of a fixed length which connect two flexible coils (F, G) cause the spacing of the coils to vary in accordance to a flex applied to the coils to adjust the relative interactive properties with flexing (FIGS. 5 A, 5B). Flexible coils (D) in modular components provide identification points on each modular component which connect to similar identification points on other flexible coil modular components (FIGS. 9 A–9C).

19 Claims, 11 Drawing Sheets

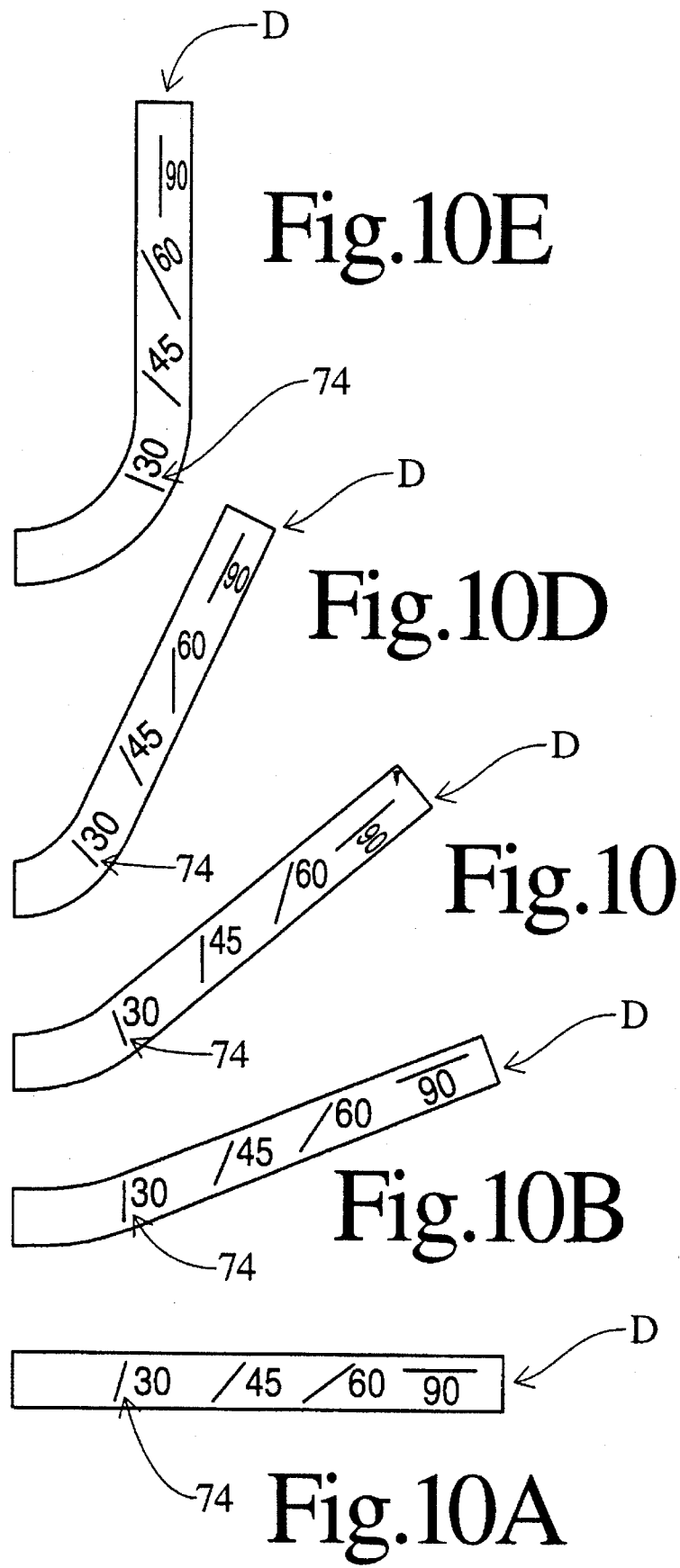

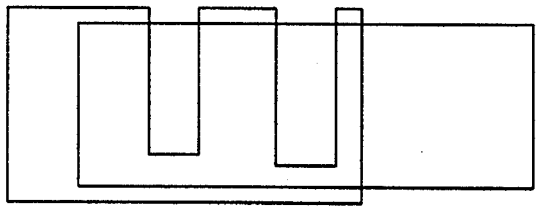
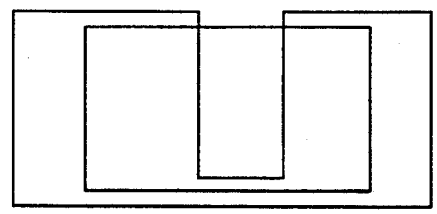
Fig.12A　　　　　　Fig.12B
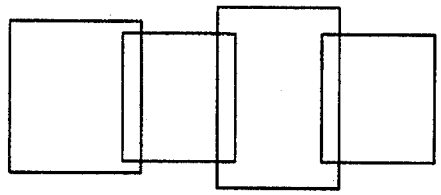
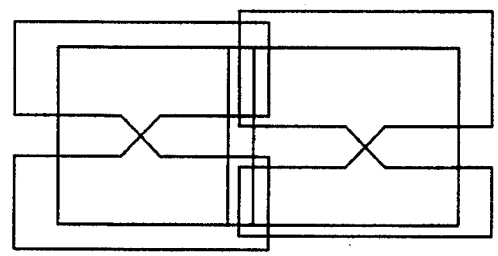
Fig.13A　　　　　　Fig.13B

FLEXIBLE NUCLEAR MAGNETIC RESONANCE RECEIVER COILS AND SYSTEMS

BACKGROUND OF THE INVENTION

The present invention relates to the art of nuclear magnetic resonance. The present invention finds particular application in the radio frequency (RF) coils used on a nuclear magnetic resonance medical imagers (MRI). The present invention may also find application in other magnetic resonance applications, such as well logging, chemical analysis, and the like.

Heretofore, whole body and localized receiving coils have been used for magnetic resonance imaging and spectroscopy of selected body areas of the patient. First, a standard sized whole body coil or body portion receiving coil is dimensioned to be disposed around the portion of the patient to be imaged. Due to the standard sizing, a significant void or empty region is defined between the coil and the portion of the patient to be imaged. As the imaged portion of the patient becomes a smaller fraction of the coil volume, the signal-to-noise ratio is decreased, degrading the image quality. One type of surface or localized coils is formed by mounting foil, wire or other conductors on stiff or rigid flat sheets of plastic or nylon. The flat coils have been constructed in a variety of sizes to facilitate being positioned adjacent a selected area of the patient to be imaged. However, their planar nature permitted only limited, partial contact with the patient.

The standard sized whole body or body portion coils and the rigid, planar coils did not permit optimization of image quality. Rather, the lack of conformity with the patient failed to optimize the filling factor and decreased the signal-to-noise ratio. These rigid coils received resonance signals from over a significantly larger area than the region of interest. This sensitivity to extraneous information degraded spatial resolution and increased aliasing in two and three-dimensional Fourier transform techniques. Improvement in the homogeneity of receiver sensitivity across the imaged space sacrificed the quality or Q factor of the coil, particularly in coils having resonance frequencies above 20 MHz. Moreover, the rigid coils were difficult to apply to the patient, uncomfortable, and created a need for a large range of inventory of coil sizes.

Other problems have been encountered in transferring the signal received by the high impedance coil over low impedance transmission lines to a remote, out of the image region preamplifier. To minimize signal loss and noise, the length of the low impedance transmission line was minimized. Although short unmatched transmission lines functioned acceptably at low frequencies, the Q factor of the coil degraded rapidly with increasing frequency and cable length.

Matching the transmission line length to the wavelength at the operating frequencies resulted in excessive length at low and mid-field strengths and lines that were too short at high fields. Because the coil impedance greatly exceeded the transmission line impedance, high cable losses attributable to standing waves on the cable were experienced. Moreover, non-zero cable dielectric and conductor losses damped the surface coil.

Attempting to match the impedance of the transmission line, whether balanced or unbalanced, has been unsuccessful. The normal variations in patient loading caused a corresponding impedance mismatch and resultant power transfer loss. At mid and high magnetic field strengths, the patient loading mismatch and transmission loss were magnified.

To overcome many of these disadvantages, flexible coil products have been manufactured from soft copper tubing and covered with a urethane foam. U.S. Pat. No. 4,920,318 of Misic, et al. discloses a flexible coil design with integrated preamplifiers. These products however, suffered from other disadvantages and limitations.

First, the copper tubing was difficult to flex and exhibited problems with stress hardening and embrittling. Also, the prior copper tubing coils were simple, linear coils which were not amenable to complex coil geometries. Furthermore, they provided limited patient comfort.

The present invention provides a new and improved coil and coil signal transmission system which overcomes the above-referenced problems and others.

SUMMARY OF THE INVENTION

In accordance with one aspect of the present invention, a flexible receiving coil assembly is provided for magnetic resonance imaging. A sheet of flexible plastic is configured to conform to a selected surface. A continuous strip of flexible foil with multiple windings, which has electrical properties and receives radio frequency magnetic resonance signals, is adhered to the flexible plastic sheet. A component, which amplifies the radio frequency magnetic resonance signals received by the foil, is mounted to the flexible plastic sheet. A cable, which extends from the component to a remote location, conveys electrical power from the remote location to the component. The cable also conveys the amplified radio frequency magnetic resonance signals to the remote location. A soft material is adhered to the flexible foil strip.

In accordance with another aspect of the present invention, a flexible receiving coil assembly with multiple windings is provided for magnetic resonance imaging. One winding of the flexible receiving coil is attached to a flexible mechanical structure using at least two mechanical connectors. Another winding of the flexible receiving coil is attached to a second end of the flexible mechanical structure using at least two additional mechanical connectors. The windings are positioned so that they cantilever over the flexible mechanical structure and overlap one another.

In accordance with another aspect of the present invention, a flexible receiving coil assembly with multiple windings is provided for magnetic resonance imaging. One winding is connected to a second winding by at least four mechanical connectors. Each of the mechanical connectors is a fixed length depending upon its distance from the longitudinal center of the first and second flexible receiving coil assemblies.

In accordance with another aspect of the present invention, at least two modular flexible receiving coil assemblies are provided for magnetic resonance imaging. The modular flexible receiving coil assemblies contain identification points which indicate where they may be attached to one another in order to minimize the mutual inductance between them.

One advantage of the present invention includes improved patient comfort.

Other advantages include improved performance and reliability.

A further advantage of the present invention is that the coil is self adjusting as it is flexed over a region of interest.

A further advantage of the present invention is to provide a flexible modular coil system. The user can custom select multiple radio frequency coils for minimizing mutual inductance and accommodating various patient sizes and regions of interest.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

FIGS. 12A and 12B illustrate two quadrature coils;

FIGS. 13A and 13B illustrate two phased array coils;

DETAILED DESCRIPTION OF THE PREFERRED EMBODIMENTS

Figure 1:
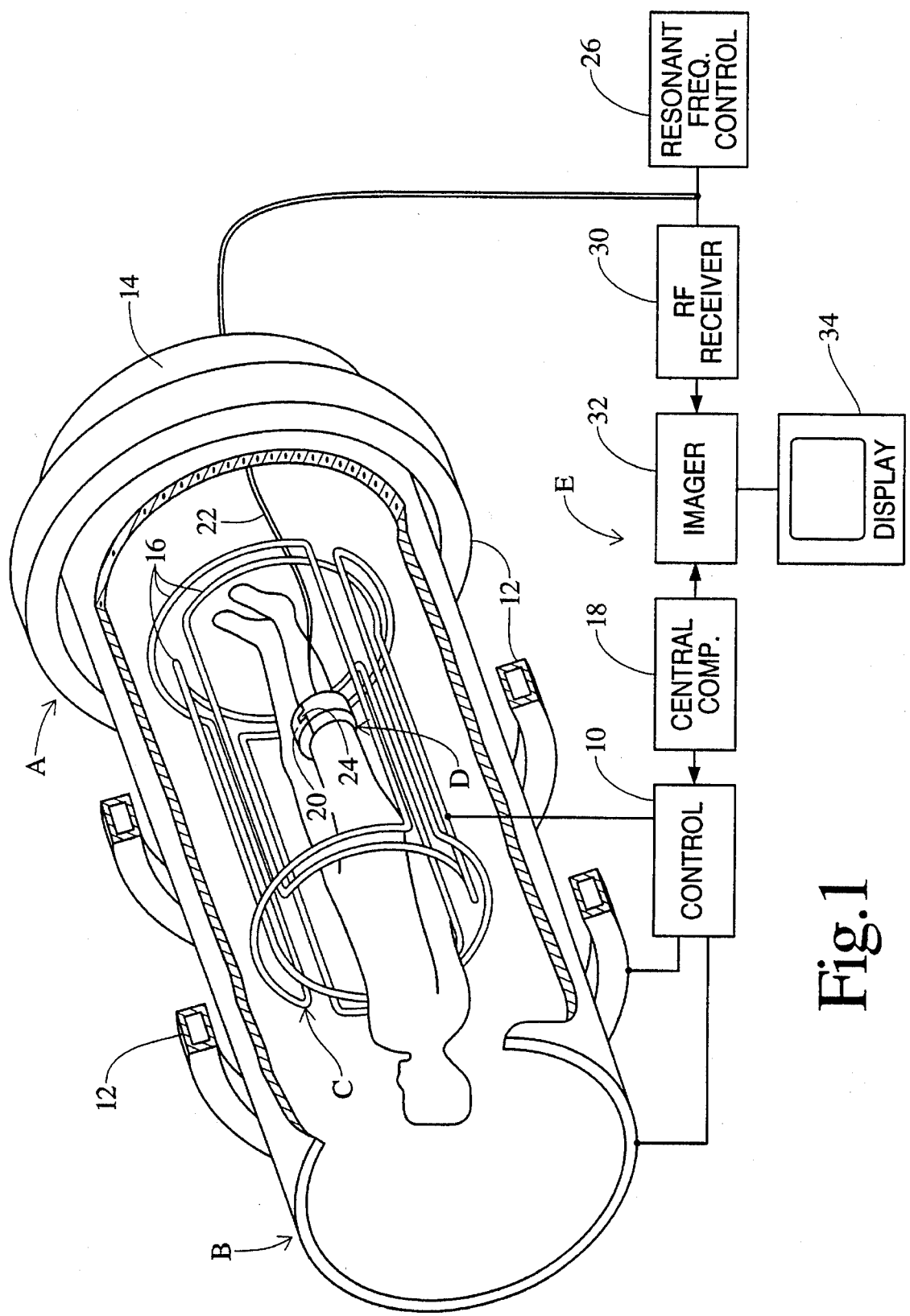
FIG. 1 is a diagrammatic illustration of a magnetic resonance imaging apparatus incorporating the present invention.

With reference to FIG. 1, a magnetic resonance imaging apparatus includes a main magnetic field apparatus A for establishing a temporally constant, main magnetic field extending longitudinally through an imaging region. A gradient field apparatus B selectively produces magnetic field gradients transversely across the main magnetic field in the image region. A magnetic resonance excitation apparatus C selectively excites magnetic resonance in selected nuclei of a patient disposed in the image region. The resonating nuclei generate radio frequency signals of a frequency which is determined by the strength of the magnetic field there adjacent and various system constants such as the gyromagnetic ratio of the nuclei. A flexible receiving coil D is disposed in conformity with a selected portion of the patient within the image region to receive radio frequency resonance signals from the resonating nuclei. Processing circuitry E converts the received radio frequency signals into a man-readable display representative of nuclei density, position, and the like.

More particularly, the main magnetic field apparatus A includes a resonance sequence control circuit 10 and a plurality of large high power magnets preferably superconducting magnets. The resonance sequence control circuit 10 also functions as a portion of the gradient field apparatus B to control the angular orientation of the transverse gradient fields generated by a gradient field coil 14. The resonance sequence control circuit 10 also selectively causes whole body radio frequency transmission coils 16 of the resonance excitation apparatus C to excite magnetic resonance. A central computer 18 coordinates the generation of the main magnetic field, the gradient magnetic field pulses, and the resonance exciting radio frequency pulses.

The flexible receiving coil D includes one or more coils of electrically conductive materials surrounded by a soft material 20, e.g., a foamed plastic. In the preferred embodiment, electrical components for adjusting the resonant frequency of the receiving coil so as to match the frequency of the resonant signals and a pre-amplifier for boosting the magnitude of the received signals are encased in the soft material. A cable 22 connects the receiving coil D and the electrical components 24 with the remotely-located processing circuitry E.

A resonant frequency control apparatus 26 is connected with the cable 22 for selectively adjusting, matching and tuning the frequency of the flexible receiving coil D. A radio frequency receiver 30 receives the resonance signals from the flexible coil D. An imager 32 receives magnetic field information and other control instructions from the central computer 18. The imager 32 reconstructs a man-readable representation or image indicative of the position, density, resonant frequency, or other characteristics of the resonating nuclei for display on a video monitor or other human-readable display 34.

Figure 2:
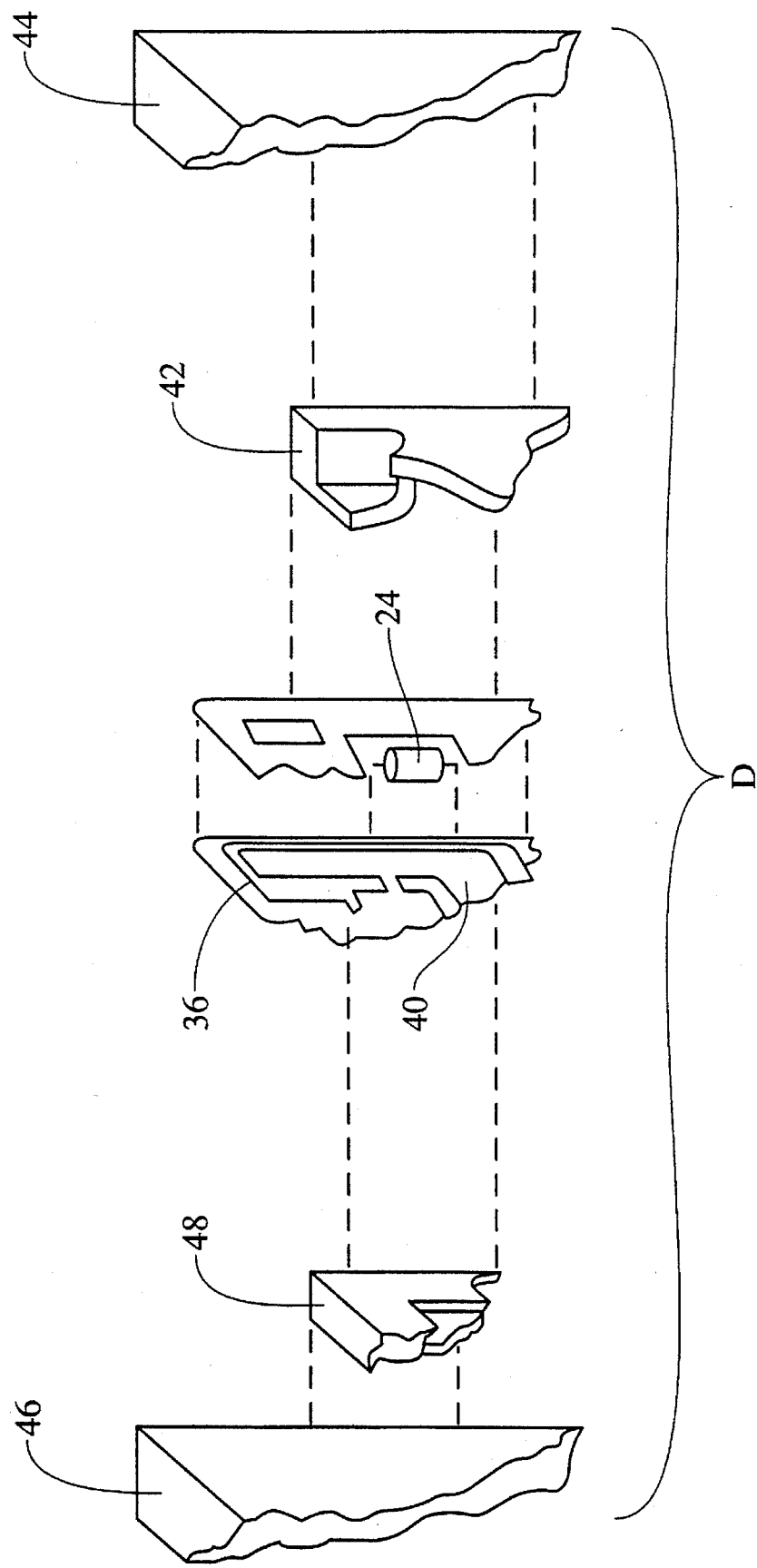
FIG. 2 is an expanded representation of components of a flexible coil in accordance with the present invention.

With particular reference to FIG. 2, the flexible coil D includes a first sheet of flexible ABS, polycarbonate, polyvinyl chloride, or like material, preferably 0.1 to 0.25 centimeters in thickness. An electrical winding 36, which is formed of a copper foil attached to a 0.01 to 0.025 centimeter thick substrate of KAPTON, polyester, MYLAR, polycarbonate, or epoxy fiberglass, is attached to a plastic sheet 40. The substrate is preferably laminated with plastic to reduce stress on the circuit and is adhesively mounted to a first face of the flexible plastic sheet 40. A first component housing 42 is also mounted to the first face of the flexible plastic sheet 40 to protect an electrical component 24 mounted thereon. The entire assembly is sandwiched between soft material layers 44, 46 for padding and patient comfort. A second-component housing 48 is adhesively attached to the second soft material layer 46 inside the assembly.

Figure 3:
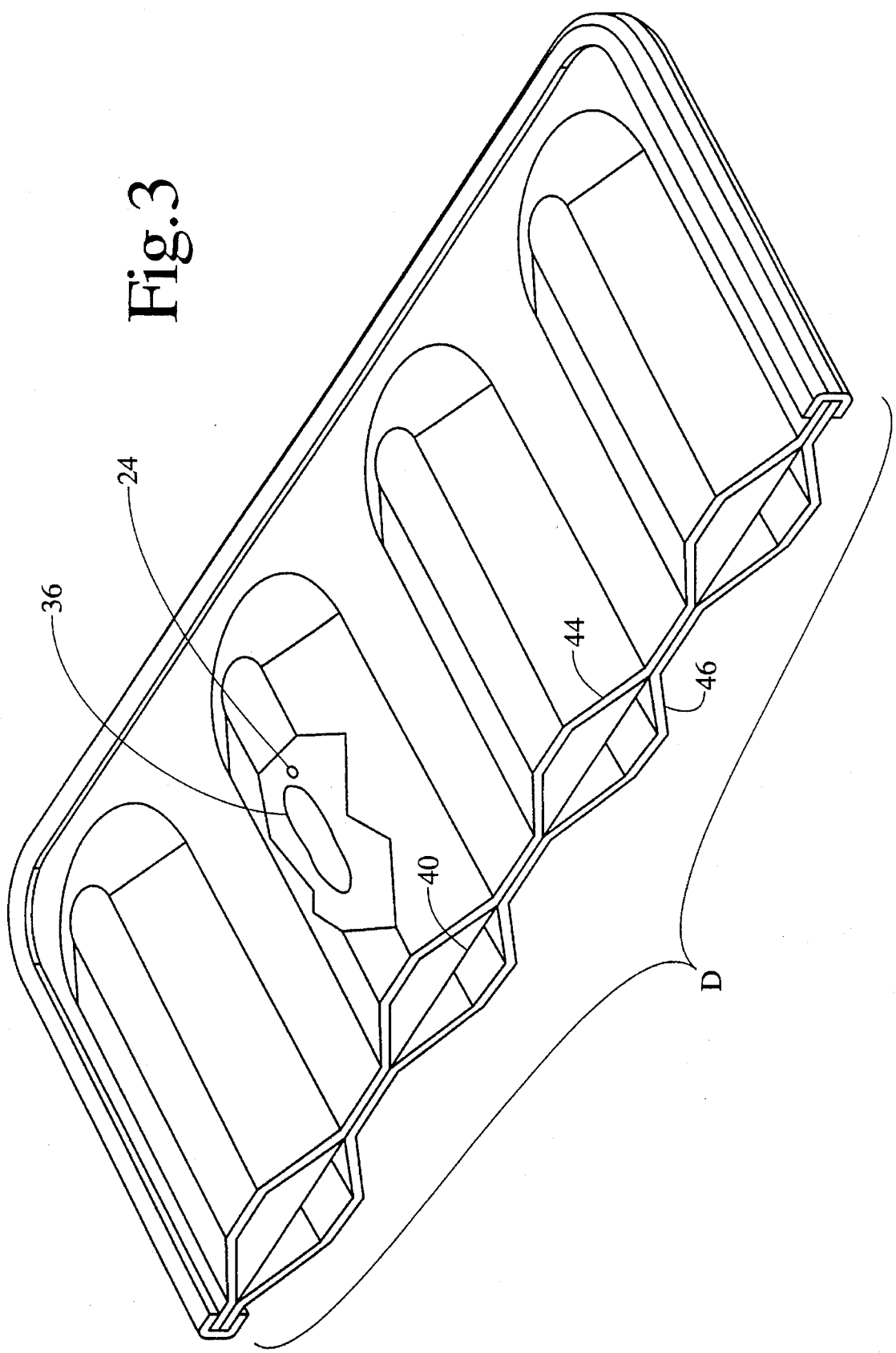
FIG. 3 is a partial sectional view of an alternate embodiment of the flexible coil.

With particular reference to FIG. 3, another embodiment of the flexible coil D includes the electrical winding 36 and a component 24 mounted to one face of the flexible plastic sheet 40. The first stiff but soft material 44 is attached to one face of the plastic sheet 40. The soft material layer 44 (preferably 0.3 to 1.3 centimeters thick soft material) includes at least one flat-shaped portion and at least one trestle-shaped portion. A second soft material layer 46 (preferably 0.3 to 1.3 centimeters thick material) is attached to a second face of the plastic sheet 40. The second soft material 46 also includes at least one flat-shaped portion and at least one trestle-shaped portion. Preferably the layers 44 and 46 have tough, non-stretching outer skins. The flat-shaped portion and trestle-shaped portion in the second layer 46 mirror the flat-shaped portion and trestle-shaped portion of the first layer 44. The top and bottom layers 44 and 46 interact with one another and the sheet 40 to affect the rigidity of the electrical winding 36. The trestle-shaped portion may be filled with a soft material or plastic material to create a rigid portion of the electrical winding which is even less flexible relative to the flat-shaped portion of the two layers 44, 46.

Other designs of these embodiments are possible. These designs replace the trestle-shaped portion of the soft or padded material layers 44, 46 with triangular or circular portions. These alternatively designed portions, like the trestle-shaped portion, may be filled with a soft material or plastic material to increase rigidity in the electrical winding 36.

Figure 4A:
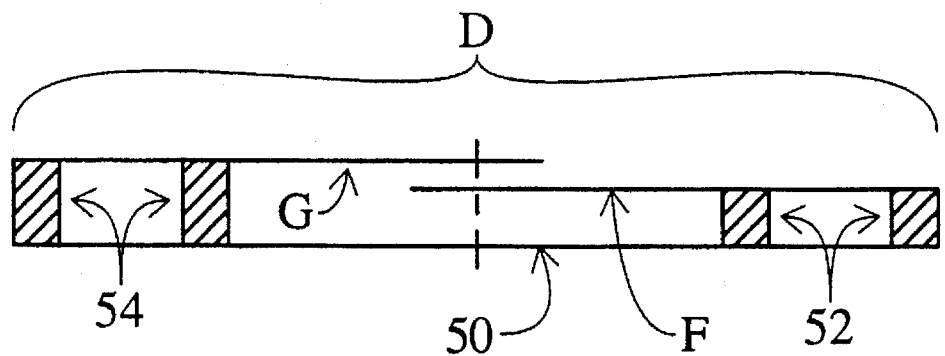
FIG. 4A illustrates another alternate embodiment showing two windings of a flexible coil which maintains minimum mutual inductance with the coil in a flat configuration.

FIG. 4A illustrates a design in which the flexible receiving coil D is flat and comprises two windings F, G to form a quadrature coil or phased array coil. The first winding F is mounted on a flexible sheet that is attached to one end of a flexible structure 50 using one or more mechanical connectors 52. The second winding G is mounted on a flexible sheet that is attached to a second end of the flexible structure 50 using one or more additional mechanical connectors 54. The windings F, G are positioned such that they cantilever over and are parallel to the flexible mechanical structure 50 and at least partially overlap one another. Preferably the overlap is selected to minimize the mutual inductance between the two windings F, G.

Figure 4B:
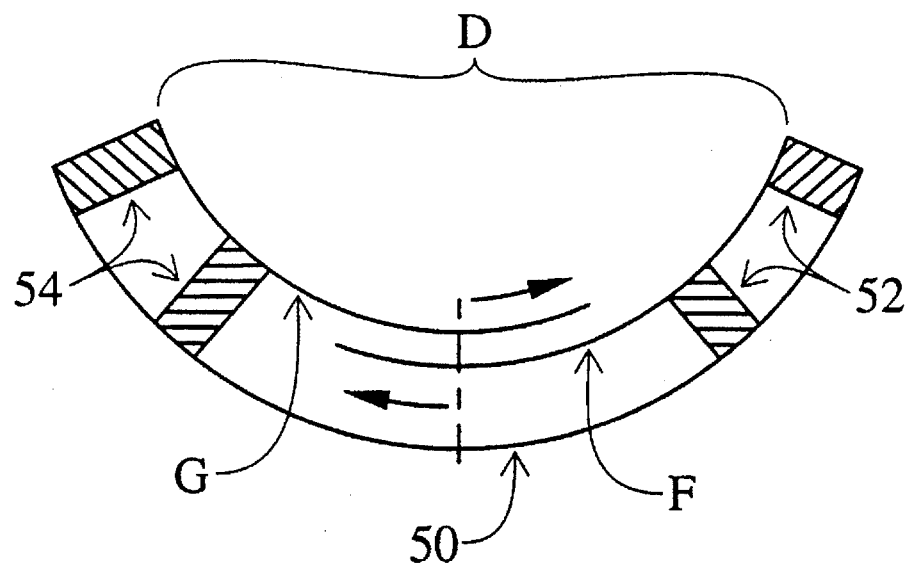
FIG. 4B illustrates the coil of FIG. 4A in its flexed configuration.

FIG. 4B illustrates the flexible receiving coil D of FIG. 4A in a flexed position. As the flexible mechanical structure 50 is flexed, the windings F, G are cammed to slide relative to each other changing the overlap. The flexing brings windings F and G towards the central portion of the structure, thus changing their mutual inductance. The change in overlap between the windings F, G is gauged such that the minimum mutual inductance is maintained as the ends of the windings F, G are bent closer to one another. The amount of overlap is based on the given geometry and positioning of the windings F and G, therefore, changing the geometry of the windings F and G.

Figure 5A:
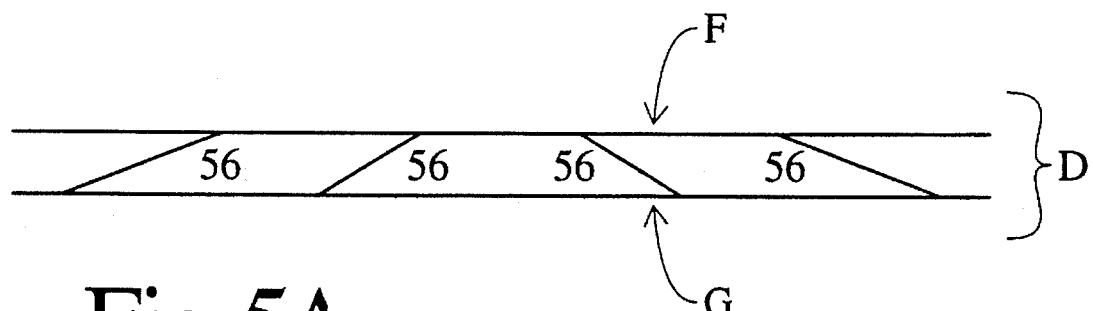
FIG. 5A illustrates another alternate embodiment showing two windings of a flexible coil which maintains minimum mutual inductance in its flat configuration.

FIG. 5A illustrates a second design in which the flexible receiving coil D comprises two windings F, G mounted on parallel flexible sheets to form a quadrature coil or phased array coil. The windings F, G are placed parallel to one another to achieve a preselected relationship, such as to minimize the mutual inductance between them. Four mechanical connectors 56, preferably pivotal rod members, are pivotally connected between the windings F, G. The mechanical connectors 56 each have a fixed length. The length of each member is selected in accordance with the distance of the member from the longitudinal center of the windings F, G.

Figure 5B:
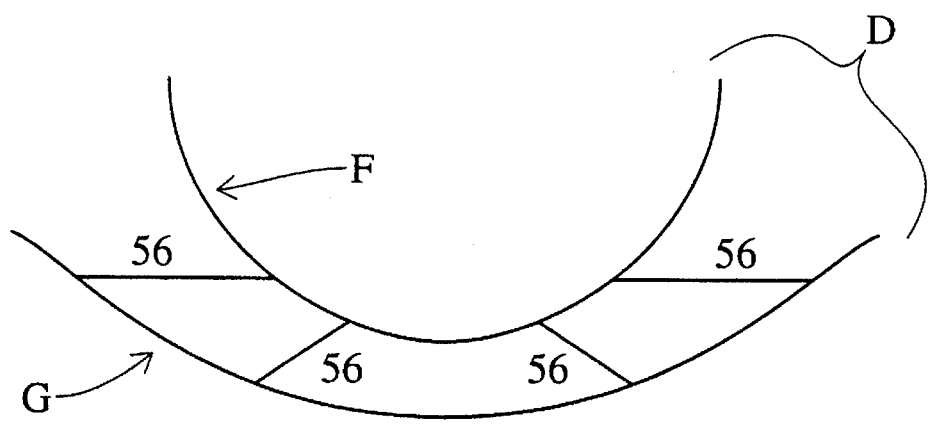
FIG. 5B illustrates the coil of FIG. 5A in its flexed configuration.

FIG. 5B illustrates the flexible receiving coil D of FIG. 5A in a flexed position. As a flex force is applied to both the windings F, G, the rigid mechanical members force the coils to a non parallel relationship. The spacing of the windings F, G varies according to the amount of flex applied. The mechanical connectors 56 are sized and positioned such that the change in minimum mutual inductance attributable to the edges of the coils being flexed closer is offset by the increased spacing of the coils along the edges.

Figure 6:
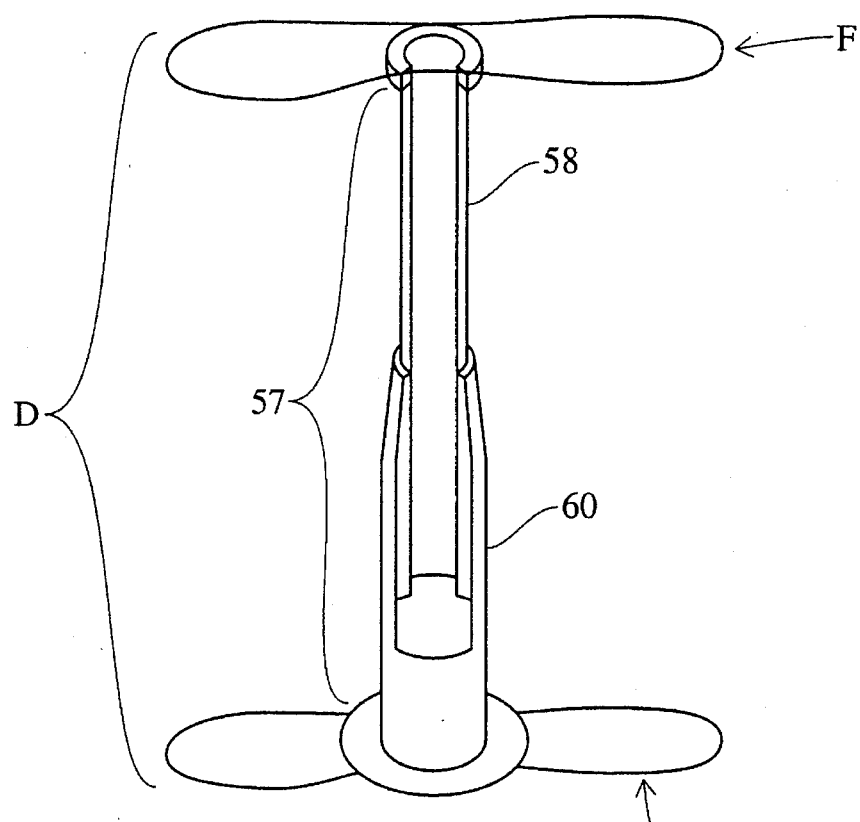
FIGS. 6, 7, and 8 illustrate movable electric conductors which connect two windings of a flexible coil.

FIG. 6 illustrates a movable electrical connecter 57 which connects different windings F, G of the flexible coil D such that they move as the coil D is flexed. Two concentric tubes, including a smaller tube 58 which slides within a larger tube 60, provide the path for the current to flow within the flexible coil D as it is flexed. Flanged ends, located at the ends of the tubes 58, 60, provide the connection points to the flexible coil D through which the current flows.

Figure 7:
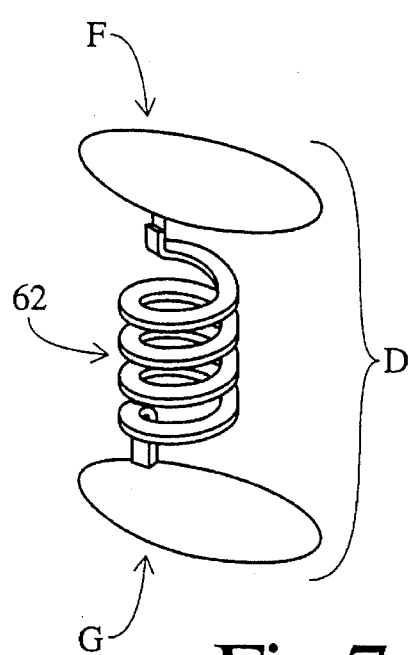

FIG. 7 illustrates a movable electrical connector 62 which connects different windings F, G of the flexible coil D to one another so that the windings F, G may move as the coil D is flexed. The helical spring connector 62 consists of a coil of copper wire, preferably co-extruded with a flexible non-conductive plastic material. It expands and contracts while providing a path for the current to flow within the flexible coil D as the coil D is flexed. The plastic material gives the spring 62 tension allowing it to contract after it is expanded. The spring connector 62 allows the flexible coil D to be wrapped around, or extended, to include an object of interest.

Figure 8:
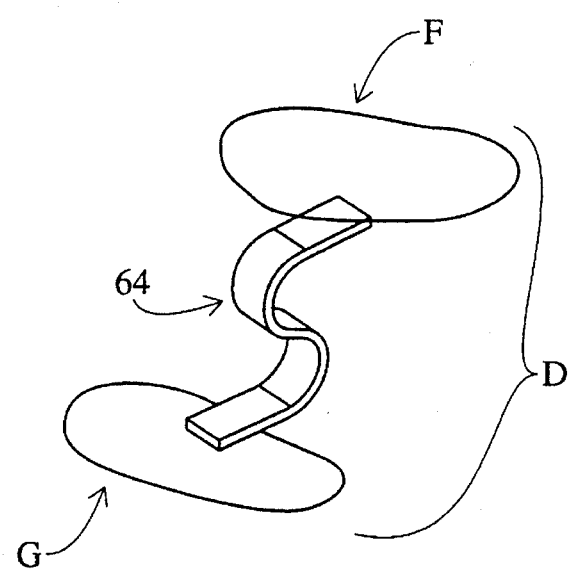

FIG. 8 illustrates a movable electrical conductor 64 which connects different windings F, G of the flexible coil D to one another so that the windings F, G may move as the coil D is flexed. The S-shaped connector 64 expands and contracts or rolls while providing a path for the current to flow within the flexible coil D as the coil D is flexed. The S-shaped connector 64 allows the flexible coil D to be wrapped around, or extended, to include an object of interest.

Figure 9A:
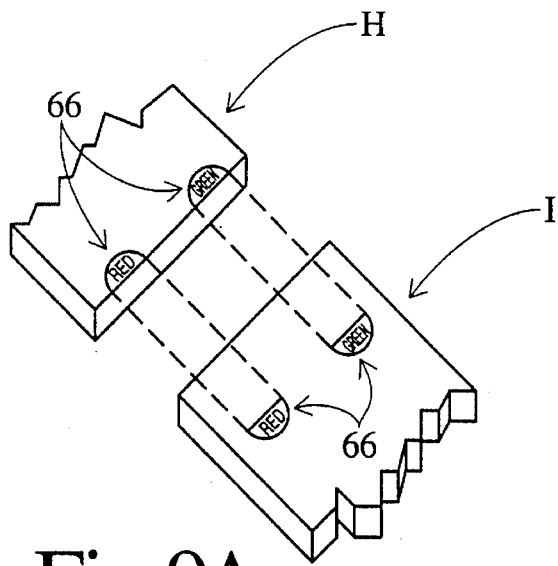
FIGS. 9A, 9B, and 9C illustrate other embodiments in which modular flexible components are aligned; and, FIGS. 10A, 10B, 10C, 10D, and 10E illustrate another embodiment of the flexible coil in various degrees of flexing including gauges for tuning the coil.
Figure 9B:
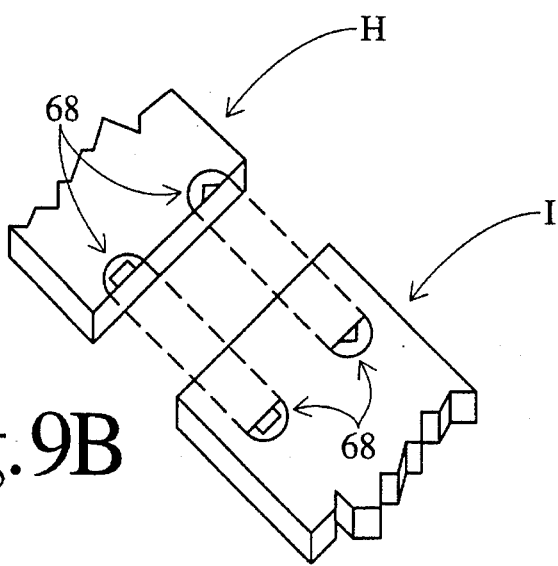
Figure 9C:
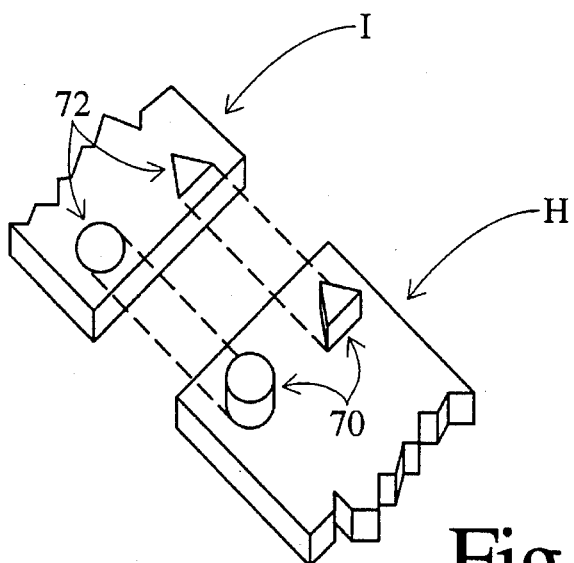
Figure 11A:
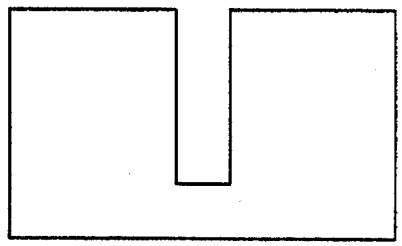
FIGS. 11A, 11B, 11C, and 11D illustrate various standard linear coils.
Figure 11B:
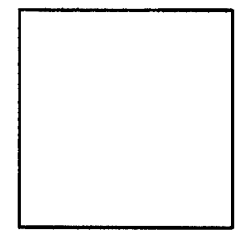
Figure 11C:
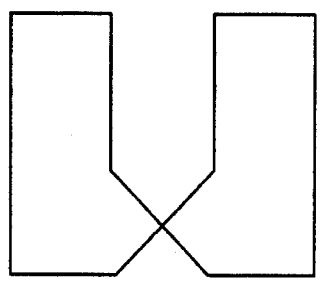
Figure 11D:
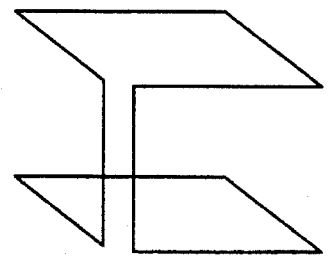

FIGS. 9A, 9B and 9C illustrate modular systems of flexible coils which allow an imaging technician to combine any number of flexible coils to obtain a desired field of view.

FIG. 9A illustrates a modular system including two modular flexible coils H, I such as individual coils that are interconnected to build a phased array coil. Colored markings 66 indicated a preselected mounting arrangement, such as the arrangement in which the mutual inductance between the coils H, I is minimized. The colored markings 66 are contiguous and aligned when the modular coils H, I are connected-to one another in the selected relationship.

FIG. 9B illustrates another embodiment of the modular system including geometric symbols 68 located on the modular flexible coils M, I. The mutual inductance between the coils M, I is minimized when the geometric symbols 68 are contiguous and aligned.

FIG. 9C illustrates yet another embodiment of the modular system. This system uses protrusions 70 located on a first modular flexible coil H and matching detents or holes 72 located on a second modular flexible coil I. The protrusions 70 and the detents 72 are interconnected to connect the modular coils H, I to one another in the preselected relationship.

Alternately, one of the protrusions and the apertures can be mounted to a support other than another coil, e.g. a vest. The coils have detents that enable them to be snap connected to selected locations on the vest or other support.

FIGS. 10A, 10B, 10C, 10D, and 10E illustrate a system for retuning the flexible coil D based on its angle of flex. A gauge 74, located on the flexible coil D, consists of two parts. The first part is a number indicating an angular degree of flex. The second part is a straight line for indicating when the flexible coil is flexed to the arbitrary angle indicated by the number. When the-flexible coil D is flexed to the angle indicated by the number, the corresponding line is in a vertical position. Once the flexible coil's D angle of flex is known, a manual switch or computer input timing for the central computer 18 is used to retune the flexible coil D or adjust the reconstruction algorithm to accommodate the flex.

FIG. 10A illustrates a system in which the coil D is flat and, therefore, none of the lines in the gauges is vertical. FIG. 10B illustrates a system in which the coil D is at a 30° angle. Therefore, the line next to the number 30 in the gauge 74 is vertical. FIG. 10C illustrates a system in which the coil D is at a 45° angle. Therefore, the line next to the number 45 in the gauge 74 is vertical. FIG. 10D illustrates a system in which the coil D is at a 60° angle. Therefore, the line next to the number 60 in the gauge 74 is vertical. FIG. 10E illustrates a system in which the coil D is at a 90° angle. Therefore, the line next to the number 90 in the gauge 74 is vertical.

FIGS. 11A, 11B, 11C, and 11D illustrate various standard linear coils which may benefit from the system described above for retuning a flexible coil based on its angle of flex.

FIGS. 12A and 12B illustrate quadrature coils which may benefit from the system described above for retuning a flexible coil based on its angle of flex.

FIGS. 13A and 13B illustrate phased array coils which may benefit from the system described above for retuning a flexible coil based on its angle of flex.

Figure 14A:
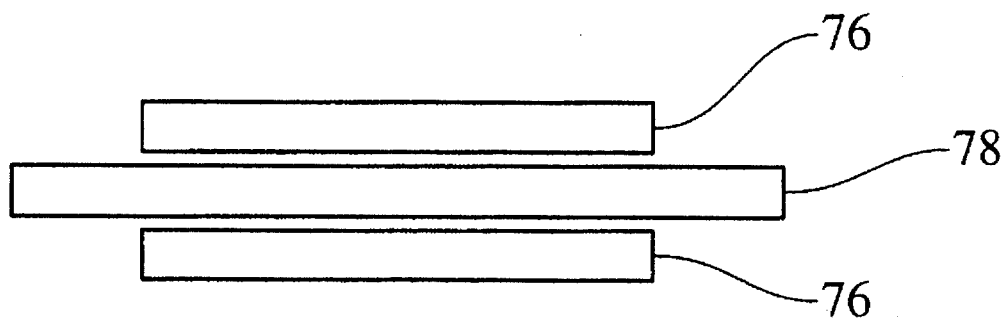
FIG. 14A illustrates a capacitor.

FIG. 14A illustrates a capacitor consisting of two copper plates 76 etched directly on a substrate 78. The substrate 78 material acts as a dielectric.

Figure 14B:
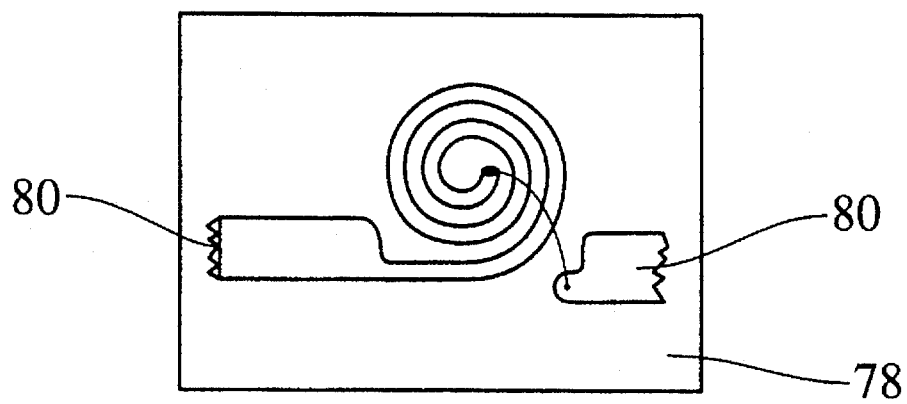
FIG. 14B illustrates an inductor.

FIG. 14B illustrates an inductor consisting of two copper windings 80 etched onto a substrate 78.

Integrating the capacitor of FIG. 14A and the inductor of FIG. 14B into the flexible coil may eliminate the need for a protective cover.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A flexible coil assembly for magnetic resonance imaging, the flexible receiving coil assembly comprising:
   a first sheet of flexible plastic material;
   an electrically continuous flexible foil strip mounted to and extending along the first sheet of flexible plastic material to receive radio frequency magnetic resonance signals;
   a circuit for enhancing the radio frequency magnetic resonance signals received by the foil, the circuit being mounted on the first sheet of flexible plastic material and being connected to the foil strip;
   a cable extending from the circuit to a remote location for conveying the received radio frequency magnetic resonance signals to the remote location;
   a first layer of soft material mounted to a first face the first sheet of flexible plastic material;
   a second layer of soft material mounted to a second face of the first sheet of flexible plastic material;
   a first flexible housing, for protecting said circuit, mounted to the first face of the first sheet of flexible plastic material; and
   a second flexible housing, for protecting said circuit, mounted to the second soft material layer.

2. A flexible coil assembly for magnetic resonance imaging, the flexible coil assembly comprising:
   a first sheet of flexible plastic material;
   an electrically continuous flexible foil strip mounted to and extending along the first sheet of flexible plastic material to receive radio frequency magnetic resonance signals;
   a cable extending from the foil strip to a remote location for conveying the received radio frequency magnetic resonance signals to the remote location;
   a first layer of soft material mounted to the first sheet of flexible plastic material, the first soft material layer including:
      at least one first flat portion for allowing the electrically continuous flexible foil strip contiguous to the first flat portion of the first soft material layer to flex; and,
      at least one first trestle-shaped portion for creating a pocket between the first soft material layer and the flexible plastic material sheet that carries the electrically continuous flexible foil strip, for inhibiting the electrically continuous flexible foil strip under the first trestle-shaped portion of the first soft material layer from flexing, and for protecting components on the flexible foil strip.

3. The flexible coil assembly as set forth in claim 2 further including:
   an electrical circuit mounted on the first sheet of flexible plastic material, the electrical circuit being connected to the foil strip.

4. The flexible coil assembly as set forth in claim 3 wherein the component is formed integrally of the flexible foil strip.

5. The flexible coil assembly as set forth in claim 2 further including a second soft material layer adhesively mounted to a second face of the first sheet of flexible plastic material, the second soft material including:
   at least one second layer flat portion, opposing the first layer flat portion, for allowing the flexible plastic material sheet that carries the electrically continuous flexible foil strip to flex; and,
   at least one second layer trestle-shaped portion, opposing the first trestle-shaped portion, for creating a pocket between the second soft material layer and the flexible plastic material sheet, for inhibiting the electrically continuous flexible foil strip under the second trestle-shaped portion of the second soft material from flexing.

6. A flexible coil assembly for magnetic resonance imaging, the flexible coil assembly comprising:
   a first sheet of flexible material;
   a first electrically continuous winding pattern on the first flexible sheet to receive radio frequency resonance signals;
   a second sheet of flexible material;
   a second electrically continuous winding pattern on a second flexible sheet to receive radio frequency magnetic signals;
   a cable extending from the first and second winding patterns to a remote location for conveying the received radio frequency magnetic resonance signals to the remote location;
   a first mechanical connector for attaching the first flexible sheet adjacent a first edge to a flexible mechanical structure such that the first winding pattern cantilevers over a central portion of the flexible mechanical structure; and,
   a second mechanical connector for attaching the second flexible sheet adjacent a second edge to the flexible mechanical structure such that the second winding pattern cantilevers over the central portion of the flexible mechanical structure resulting in a partial overlap between the first winding pattern and the second winding pattern, which partial overlap varies as the first and second flexible sheets and the flexible mechanical structure are flexed.

7. A flexible coil assembly for magnetic resonance imaging, the flexible coil assembly comprising:
   a first sheet of flexible
   a first electrically continuous winding pattern on the first flexible sheet;
   a second sheet of flexible material;
   a second electrically continuous winding pattern on the second flexible sheet;
   a cable extending from the foil strip to a remote location for conveying the received radio frequency magnetic resonance signals to the remote location;
   a first layer of soft material mounted to one of the first and second sheets of flexible plastic material;
   at least three pivotal rod members pivotally connecting the first flexible sheet to the second flexible sheet, the pivotal rod members each having a fixed length and being pivotally connected between the first and second flexible sheets and being positioned such that as a flexing force is applied to the rod member pivots a spacing between the first and second flexible sheet is caused to change.

8. A flexible coil assembly for magnetic resonance, the flexible coil assembly comprising:
   a first sheet of flexible material;
   a first electrically continuous flexible strip mounted to and extending along the first sheet of flexible material to receive radio frequency magnetic resonance signals;
   a second sheet of flexible material;
   a second electrically continuous flexible strip mounted to a second flexible sheet for receiving the radio frequency magnetic resonance signals;
   at least one electrical connector for connecting the first and second electrically continuous flexible strips;
   a cable extending from at least one of the first and second flexible strips to a remote location for conveying the received radio frequency magnetic resonance signals to a remote location.

9. The flexible coil as set forth in claim 8 wherein, flexing the first and second flexible sheets alters a magnetic relationship between the first and second flexible strips and further including:
   a means for altering at least one of spacing and overlap between the first and second flexible strips as the first and second sheets are flexed to optimize the magnetic relationship therebetween at a multiplicity of degrees of flexation.

10. The flexible coil assembly as set forth in claim 8 wherein the electrical connector includes a helix having a conductive layer and a nonconductive layer, the conductive layer being connected with the first and second foil strips.

11. The flexible coil assembly as set forth in claim 8 wherein the electrical connector includes:
   a smaller conductive tube which is slidingly received in a larger conductive tube;
   a flanged end on the smaller tube for connecting the smaller tube to the first flexible foil strip; and,
   a flanged end on the larger tube for connecting the larger tube to the second flexible foil strip.

12. The flexible coil assembly as set forth in claim 8 wherein the electrical connector includes an s-shaped conductor connected between the first and second foil strips.

13. A flexible coil assembly for magnetic resonance imaging, the flexible coil assembly comprising:
   a first flexible coil including:
      a first sheet of flexible plastic material;
      a first electrically continuous flexible strip mounted to and extending along the first sheet of flexible plastic material to receive radio frequency magnetic resonance signals;
      a first layer of soft material mounted to the first sheet of flexible plastic material; and,
      a first alignment identification indicia;
   a second flexible coil including:
      a second sheet of flexible plastic material;
      a second electrically continuous flexible strip mounted to and extending along the second sheet of flexible plastic material to receive radio frequency magnetic resonance signals;
      a second layer of soft material mounted to the second sheet of flexible plastic material; and,
      a second alignment identification indicia, the first and second alignment indicia being selectively alignable in an abutting relationship; and,
   a mechanical connection for connecting the first and second flexible coil with the first and second alignment indicia aligned;
   a cable extending from the at least one of the first and second electrically continuous strips to a remote location for conveying the received radio frequency magnetic resonance signals to the remote location.

14. The flexible receiving coil assembly as set forth in claim 13 wherein the alignment indicia include at least one of:
   a series of matching color marks;
   a series of matching symbols; and,
   matching protrusion and opening combinations.

15. A flexible coil assembly for magnetic resonance imaging, the flexible coil assembly comprising:
   a sheet of flexible plastic material;
   an electrically continuous flexible strip mounted to and extending along the sheet of flexible plastic material to receive radio frequency magnetic resonance signals;
   a cable extending from the flexible strip to a remote location for conveying the received radio frequency magnetic resonance signals to the remote location;
   a layer of soft material mounted to the first sheet of flexible plastic material; and,
   at least one set of gauge indicia mounted to the soft material layer for indicating a degree of flexation of the flexible coil assembly.

16. The flexible coil assembly as set forth in claim 15 wherein the gauge indicia includes:
   a plurality of angle indicators; and,
   an angled line next to each angle indicator, each line being angled such that it is vertical when the coil assembly is flexed by the indicated angle.

17. A modular coil assembly for magnetic resonance imaging, the modular coil assembly comprising:
   a first modular coil including:
      a first flexible plastic sheet;
      a first electrically continuous flexible foil strip mounted to and extending along the first flexible plastic sheet to receive radio frequency magnetic resonance signals; and, a first alignment indicia; and, a second modular coil including:

a second flexible plastic sheet;

a second electrically continuous flexible foil strip mounted to and extending along the first flexible plastic sheet to receive radio frequency magnetic resonance signals; and, a second alignment indicia for indicating a preferred interconnection for achieving minimum mutual inductance between the first and second modular coils; and, a mechanical connection for connecting the first modular coil to the second modular coil with the first and second indicia aligned.

18. A modular coil assembly for magnetic resonance imaging, the modular coil assembly comprising:

a first modular coil including:

a first flexible plastic sheet;

a first electrically continuous flexible foil strip mounted to and extending along the first flexible plastic sheet to receive radio frequency magnetic resonance signals; and a protrusion on the first modular coil;

a second modular coil including:

a second flexible plastic sheet;

a second electrically continuous flexible foil strip mounted to and extending along the first flexible plastic sheet to receive radio frequency magnetic resonance signals; and, an aperture in the second modular coil which mates with the protrusion to fasten the first and second modular coils together in a preset relationship.

19. A magnetic resonance imaging apparatus including:

a main magnetic field generator for generating a temporally constant main magnetic field through an image region;

gradient field coils for producing magnetic field gradients across the main magnetic field in the image region;

a radio frequency transmitter for exciting and manipulating magnetic resonance in nuclei in the image region;

a patient couch for supporting a patient in the image region;

a coil for receiving magnetic resonance signals from the image region, the coil including:

a first sheet of flexible plastic material;

a second sheet of flexible plastic material;

a first electrically continuous flexible foil strip mounted to and extending along at least one face of the first sheet of flexible plastic material to receive radio frequency magnetic resonance signals;

a second electrically continuous flexible foil strip mounted to and extending along at least one face of the second sheet of flexible plastic material to receive radio frequency magnetic resonance signals;

a mechanical connector for adjustably connecting the first and second flexible sheets together such that as the first and second sheets are flexed, a relationship between the first and second flexible foil strips is altered to compensate for the flexing; and, a soft layer mounted to one of the first and second flexible sheets;

an image reconstruction processor for reconstructing an image representation from the received magnetic resonance signals; and, cables extending from the foil strips to the image reconstruction processor for conveying the received radio frequency magnetic resonance signals from the receiving coil assembly to the reconstruction processor.

* * * * *